(12) United States Patent
Chmelar et al.

(10) Patent No.: US 7,956,790 B2
(45) Date of Patent: Jun. 7, 2011

(54) SYSTEMS AND METHODS FOR SYNCHRONOUS, RETIMED ANALOG TO DIGITAL CONVERSION

(75) Inventors: Erik Chmelar, Midland, MI (US); Choshu Ito, San Mateo, CA (US); William Loh, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/669,481

(22) PCT Filed: Jun. 6, 2008

(86) PCT No.: PCT/US2008/066060
§ 371 (c)(1),
(2), (4) Date: Jan. 16, 2010

(87) PCT Pub. No.: WO2009/148457
PCT Pub. Date: Dec. 10, 2009

(65) Prior Publication Data
US 2010/0194616 A1   Aug. 5, 2010

(51) Int. Cl.
*H03M 1/34* (2006.01)
(52) U.S. Cl. .......................... 341/158; 341/159
(58) Field of Classification Search .................. 341/158, 341/159, 155, 156, 118
See application file for complete search history.

(56) References Cited

U.S. PATENT DOCUMENTS

| | | | |
|---|---|---|---|
| 4,672,518 A | 6/1987 | Murdock | |
| 4,686,617 A | 8/1987 | Colton | |
| 4,837,495 A | 6/1989 | Zansky | |
| 4,885,674 A | 12/1989 | Varga et al. | |
| 4,912,470 A | * 3/1990 | Hosotani et al. | 341/159 |
| 4,918,450 A | 4/1990 | Sugiyama et al. | |
| 5,072,221 A | 12/1991 | Schmidt | |

(Continued)

OTHER PUBLICATIONS

U.S. Appl. No. 12/024,893, filed Feb. 1, 2008, Bailey.

(Continued)

*Primary Examiner* — Rexford N Barnie
*Assistant Examiner* — Joseph Lauture
(74) *Attorney, Agent, or Firm* — Hamilton, DeSanctis & Cha (LSI)

(57) ABSTRACT

Various embodiments of the present invention provide systems and methods for analog to digital conversion. For example, a retimed analog to digital converter is disclosed that includes a first set of sub-level interleaves and a second set of sub-level interleaves. The first set of sub-level interleaves includes a first sub-level interleave with a first set of comparators synchronized to a first clock phase, and a second sub-level interleave with a second set of comparators synchronized to a second clock phase. The second set of sub-level interleaves includes a third sub-level interleave with a third set of comparators synchronized to a third clock phase, and a fourth sub-level interleave with a fourth set of comparators synchronized to a fourth clock phase. A global interleave selects one of the first set of comparators based at least in part on an output from the second set of sub-level interleaves, and one of the third set of comparators based at least in part on an output from the first set of sub-level interleaves. In some instances of the aforementioned embodiments, an output of the first sub-level interleave and an output of the second sub-level interleave are synchronized to the third clock phase, and an output of the third sub-level interleave and an output of the fourth sub-level interleave are synchronized to the first clock phase.

20 Claims, 5 Drawing Sheets

U.S. PATENT DOCUMENTS

| | | | |
|---|---|---|---|
| 5,173,698 | A | 12/1992 | Gulczynski |
| 5,182,477 | A | 1/1993 | Yamasaki et al. |
| 5,225,837 | A | 7/1993 | Hosotani et al. |
| 5,272,701 | A | 12/1993 | Tsuruoka |
| 5,296,856 | A | 3/1994 | Mantong |
| 5,418,493 | A | 5/1995 | Dijkmans |
| 5,510,745 | A | 4/1996 | Hamano et al. |
| 5,689,178 | A | 11/1997 | Otake |
| 5,734,297 | A | 3/1998 | Huijsing et al. |
| 5,789,973 | A | 8/1998 | Barrett et al. |
| 5,801,564 | A | 9/1998 | Gasparik |
| 5,809,060 | A | 9/1998 | Cafarella et al. |
| 5,861,829 | A | 1/1999 | Sutardja |
| 5,874,911 | A | 2/1999 | Kodama |
| 5,929,705 | A | 7/1999 | Zhang et al. |
| 5,936,466 | A | 8/1999 | Andoh et al. |
| 6,002,356 | A | 12/1999 | Cooper |
| 6,011,502 | A | 1/2000 | Kao |
| 6,081,219 | A | 6/2000 | Prasanna |
| 6,111,467 | A | 8/2000 | Luo |
| 6,181,269 | B1 | 1/2001 | Nishiuchi et al. |
| 6,225,859 | B1 | 5/2001 | Irvine et al. |
| 6,232,908 | B1 | 5/2001 | Nakaigawa |
| 6,369,743 | B2 | 4/2002 | Ono |
| 6,373,423 | B1 | 4/2002 | Knudsen |
| 6,404,372 | B1 | 6/2002 | Heithoff |
| 6,404,374 | B1 | 6/2002 | Yu et al. |
| 6,556,081 | B2 | 4/2003 | Muza |
| 6,556,158 | B2 | 4/2003 | Steensgaard-Madsen |
| 6,563,445 | B1 | 5/2003 | Sabouri |
| 6,580,382 | B2 | 6/2003 | Yung |
| 6,600,373 | B1 | 7/2003 | Bailey et al. |
| 6,605,993 | B2 | 8/2003 | Suzuki |
| 6,653,966 | B1 | 11/2003 | van der Goes et al. |
| 6,717,945 | B1 | 4/2004 | Jue et al. |
| 6,744,432 | B1 | 6/2004 | Morein |
| 6,756,841 | B2 | 6/2004 | Jaussi et al. |
| 6,784,824 | B1 | 8/2004 | Quinn |
| 6,816,101 | B2 | 11/2004 | Hietala et al. |
| 6,922,083 | B2 | 7/2005 | Tanaka et al. |
| 6,956,517 | B1 | 10/2005 | Baker et al. |
| 7,002,504 | B2 | 2/2006 | McMahill |
| 7,019,507 | B1 | 3/2006 | Dittmer et al. |
| 7,116,260 | B2 | 10/2006 | Luh |
| 7,129,874 | B2 | 10/2006 | Bjornsen |
| 7,190,298 | B2 | 3/2007 | Mulder |
| 7,209,068 | B1 | 4/2007 | Chen et al. |
| 7,233,277 | B2 | 6/2007 | Roh |
| 7,262,724 | B2 | 8/2007 | Hughes et al. |
| 7,333,580 | B2 | 2/2008 | Parhi |
| 7,362,153 | B2 | 4/2008 | Sumesaglam |
| 7,471,228 | B2 | 12/2008 | Cho et al. |
| 7,482,844 | B2 | 1/2009 | Brady et al. |
| 7,696,915 | B2 | 4/2010 | Chmelar et al. |
| 2002/0186776 | A1 | 12/2002 | Cosand |
| 2005/0151588 | A1 | 7/2005 | Bailey et al. |
| 2006/0071709 | A1 | 4/2006 | Maloberti et al. |
| 2006/0132242 | A1 | 6/2006 | Han et al. |
| 2007/0183006 | A1 | 8/2007 | Lee |
| 2008/0048896 | A1 | 2/2008 | Parthasarthy et al. |

OTHER PUBLICATIONS

U.S. Appl. No. 12/024,909, filed Feb. 1, 2008, Bailey.

U.S. Appl. No. 12/025,897, filed Nov. 20, 2007, Bailey et al.

U.S. Appl. No. 12/025,914, filed Nov. 20, 2007, Bailey et al.

U.S. Appl. 12/134,488, filed Jun. 6, 2008, Chmelar.

U.S. Appl. 12/134,501, filed Jun. 6, 2008, Chmelar.

U.S. Appl. 12/134,523, filed Jun. 6, 2008, Chmelar.

Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.

Diato et al., "A 14-bit 20-MS/s Pipelined ADC With Digital Distortion Calibration," IEEE J. Solid-State Circuits, vol. 41, No. 11, pp. 2417-2423. Nov. 2006.

Gupta, et al., "A 1 GS/s 11 b Time Interleaved ADC in 0.13um CMOS", ISSCC Dig. Tech. Papers, pp. 576-577, Feb 2006.

Katsuria, S. et al., "Techniques for High-Speed Implementationof Nonlinear Cancellation", IEEE Joun. Communications, vol. 9, No. 5, Jun. 1991, pp. 711-717.

Kim et al., "A 10-b, 10MS/s CMOS A/D Converter", IEEE J. Solid State Circuits, vol. 32, No. 3, pp. 302-311, Mar. 1997.

Mangelsdorf, C.W., "A 400-MHz Input Flash Converter With Error Correction", IEEE Journal of Solid-State Circuits, pp. 184-191, Feb 1990, vol. 25 Issue 1.

Mehr, et al., "A 55-mW, 10-bit, 40-Msample/s Nyquist-Rate CMOS ADC," IEEE J. Solid-State Circuits, vol. 35, No. 3, pp. 302-311, Mar. 2000.

Nagaraj et al., "A 250 mW 8-b, 52 Msamples/s Parallel-Pipelined A/D Converter with Reduced Number of Amplifiers", IEEE J. Solid State Circuits, vol. 32, pp. 312-320, Mar. 1997.

Schinkel, Daniel et al. A double-Tail Latch-Type Voltage Sense Maplifier with 18ps Setup+Hold Time, Feb. 13, 2007, ISSCC 2007, Session 13, pp. 314-15 and 605 IEEE.

Schmid & Moschtz, "A Tunable, Video-Frequency, Low Power Single Amplifier Biquadratic Filter in CMOS", Circuits and Systems, 1999, ISCAS'99. IEEE Int. Sym. on vol. 2, May 2.

Sedra, Adel S. et al. "Optimum Configurations for Single-Amplifier Biquadratic Filters" Dec. 1980, IEEE Trans. On Cir. and Sys., vol. CAS-27, No. 12, pp. 1155-1163.

Singer et al., "A 14-bit 10-MHz Calibrations-Free CMOS Pipelined A/D Converter," in Symp. VLSI Circuits Dig. Tech Papers, Jun. 1996, pp. 38-39.

U.S. Appl. No. 12/669,482, filed Jun. 6, 2008, Chmelar.

\* cited by examiner

SYSTEMS AND METHODS FOR SYNCHRONOUS, RETIMED ANALOG TO DIGITAL CONVERSION

BACKGROUND OF THE INVENTION

The present inventions are related to systems and methods for processing digital signals, and more particularly to systems and methods for analog to digital conversion.

Analog to digital converters are used in a number of semiconductor devices to convert an analog electrical signal to a digital representation thereof. In the conversion process, a continuous analog signal is converted to a series of discrete or quantized digital values representing the analog signal at defined sample times. Simple analog to digital converters operate over a specified, static range of operation typically defined to encompass an expected analog input signal. FIG. 1 depicts an exemplary prior art flash analog to digital converter 100. Flash analog to digital converter 100 includes a comparator bank 120 including a number of comparators 121, 122, 123, 124, 125 that each receive a respective reference threshold (i.e., ref(n-1), ref(n-2), ref(3), ref(2) and ref(1)). In addition, each of comparators 121, 122, 123, 124, 125 receives an analog input 105, and compares analog input 105 to the respective reference threshold. The reference thresholds are chosen such that the combined output of comparator bank 120 is a thermometer code indicated as a digital output 170. When operating properly, digital output 170 includes an uninterrupted series of 0's followed by an uninterrupted series of 1s with the transition between 0s and is indicating the level of analog input 105 (i.e., a thermometer code without bubbles). In some cases, digital output 170 is provided to an encoder 180 that provides an encoded output 190 that may be more compact than a thermometer code.

In such a flash analog to digital converter, increased resolution is provided by reducing the level difference between successive reference voltages. Where the range of analog to digital converter 100 is to be maintained constant, increasing resolution requires a corresponding increase in the number of comparators. This has at least two disadvantages. First, additional comparators increase power and area consumption. Second, noise on analog input 105 and process differences in comparators 121, 122, 123, 124, 125 often results in production of an imperfect thermometer code (i.e., a thermometer code exhibiting bubbles) where the difference between successive reference voltages becomes small. Consequently, to compensate for the imperfections in the thermometer code, the complexity of encoder 180 increases substantially. This results in additional undesirable power and area costs.

Hence, for at least the aforementioned reasons, there exists a need in the art for advanced systems and methods for analog to digital conversion.

BRIEF SUMMARY OF THE INVENTION

The present inventions are related to systems and methods for processing digital signals, and more particularly to systems and methods for analog to digital conversion.

Various embodiments of the present invention provide retimed analog to digital converter circuits. Such analog to digital converter circuits include a first set of sub-level interleaves and a second set of sub-level interleaves. The first set of sub-level interleaves includes a first sub-level interleave with a first set of comparators synchronized to a first clock phase, and a second sub-level interleave with a second set of comparators synchronized to a second clock phase. The second set of sub-level interleaves includes a third sub-level interleave with a third set of comparators synchronized to a third clock phase, and a fourth sub-level interleave with a fourth set of comparators synchronized to a fourth clock phase. A global interleave selects one of the first set of comparators based at least in part on an output from the second set of sub-level interleaves, and one of the third set of comparators based at least in part on an output from the first set of sub-level interleaves. In some instances of the aforementioned embodiments, an output of the first sub-level interleave and an output of the second sub-level interleave are synchronized to the third clock phase, and an output of the third sub-level interleave and an output of the fourth sub-level interleave are synchronized to the first clock phase.

Other embodiments of the present invention provide methods for analog to digital conversion. The methods include performing a first set of analog to digital conversions using a first set of comparators; performing a second set of analog to digital conversions using a second set of comparators; performing a third set of analog to digital conversions using a third set of comparators; and performing a fourth set of analog to digital conversions using a fourth set of comparators. A result from the first set of analog to digital conversions is selected based at least in part on a first registered result to provide a first selected result. A result from the second set of analog to digital conversions is selected based at least in part on the first selected result to provide a second selected result. A result from the third set of analog to digital conversions is selected based at least in part on the second registered result to provide a third selected result. A results from the fourth set of analog to digital conversions is selected based at least in part on the third selected result to provide a fourth selected result. The fourth selected result is registered to provide the first registered result, and the second selected result is registered to provide the second registered result. In some cases, performing the first set of analog to digital conversions is synchronized to a first clock phase; performing the second set of analog to digital conversions is synchronized to a second clock phase; performing the third set of analog to digital conversions is synchronized to a third clock phase; and performing the fourth set of analog to digital conversions is synchronized to a fourth clock phase. In some cases, registering the fourth selected result is synchronized to the first clock phase, and registering the second selected result is synchronized to the third clock phase.

Yet other embodiments of the present invention provide communication systems. Such communication systems include a receiver utilizing at least one retimed analog to digital converter. The retimed analog to digital converter includes a first set of sub-level interleaves and a second set of sub-level interleaves. The first set of sub-level interleaves includes a first sub-level interleave with a first set of comparators synchronized to a first clock phase, and a second sub-level interleave with a second set of comparators synchronized to a second clock phase. The second set of sub-level interleaves includes a third sub-level interleave with a third set of comparators synchronized to a third clock phase, and a fourth sub-level interleave with a fourth set of comparators synchronized to a fourth clock phase. A global interleave selects one of the first set of comparators based at least in part on an output from the second set of sub-level interleaves, and one of the third set of comparators based at least in part on an output from the first set of sub-level interleaves. In some instances of the aforementioned embodiments, an output of the first sub-level interleave and an output of the second sub-level interleave are synchronized to the third clock phase, and an output of the third sub-level interleave and an output of the fourth sub-level interleave are synchronized to the first clock phase.

In some instances of the aforementioned embodiments, the systems include a transmitter and a medium. In such instances, information is provided from the transmitter to the receiver via the medium. In one particular case, the system is a storage system, and the medium is a storage medium. In another particular case, the system is a wireless communication system, and the medium is a wireless communication medium.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3b is a timing diagram depicting an exemplary operation of the synchronous, retimed analog to digital converter of FIG. 3a.

DETAILED DESCRIPTION OF THE INVENTION

The present inventions are related to systems and methods for processing digital signals, and more particularly to systems and methods for analog to digital conversion.

A dynamic range analog to digital converter is a special purpose analog to digital converter that may be used for detecting a bit sequence transmitted through a known channel. An example of a dynamic analog to digital converter is described in U.S. patent application Ser. No. 12/108,791 entitled "Analog-To-Digital Converter" and filed Apr. 24, 2008 by Chmelar et al. The aforementioned application is incorporated herein by reference for all purposes. Such a dynamic analog to digital converter employs one or more comparators that compare an input against a reference voltage. The output of the dynamic analog to digital converter may then be used to select an input range for comparison during a subsequent bit period.

Figure 2A:
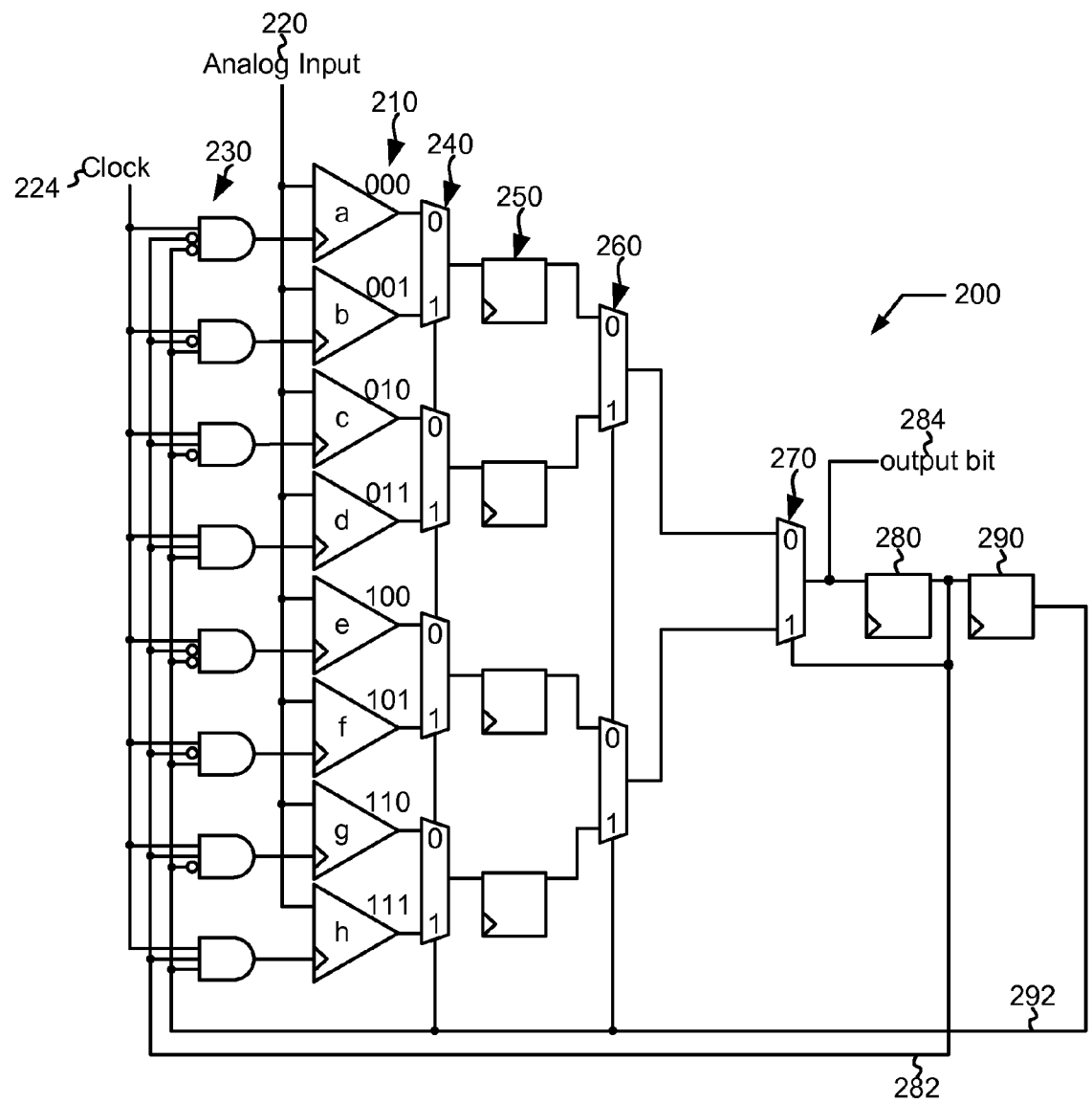
FIG. 2a is an analog to digital converter using a multiplexer tree implemented in combinatorial logic in accordance with some embodiments of the present invention.
Figure 2B:
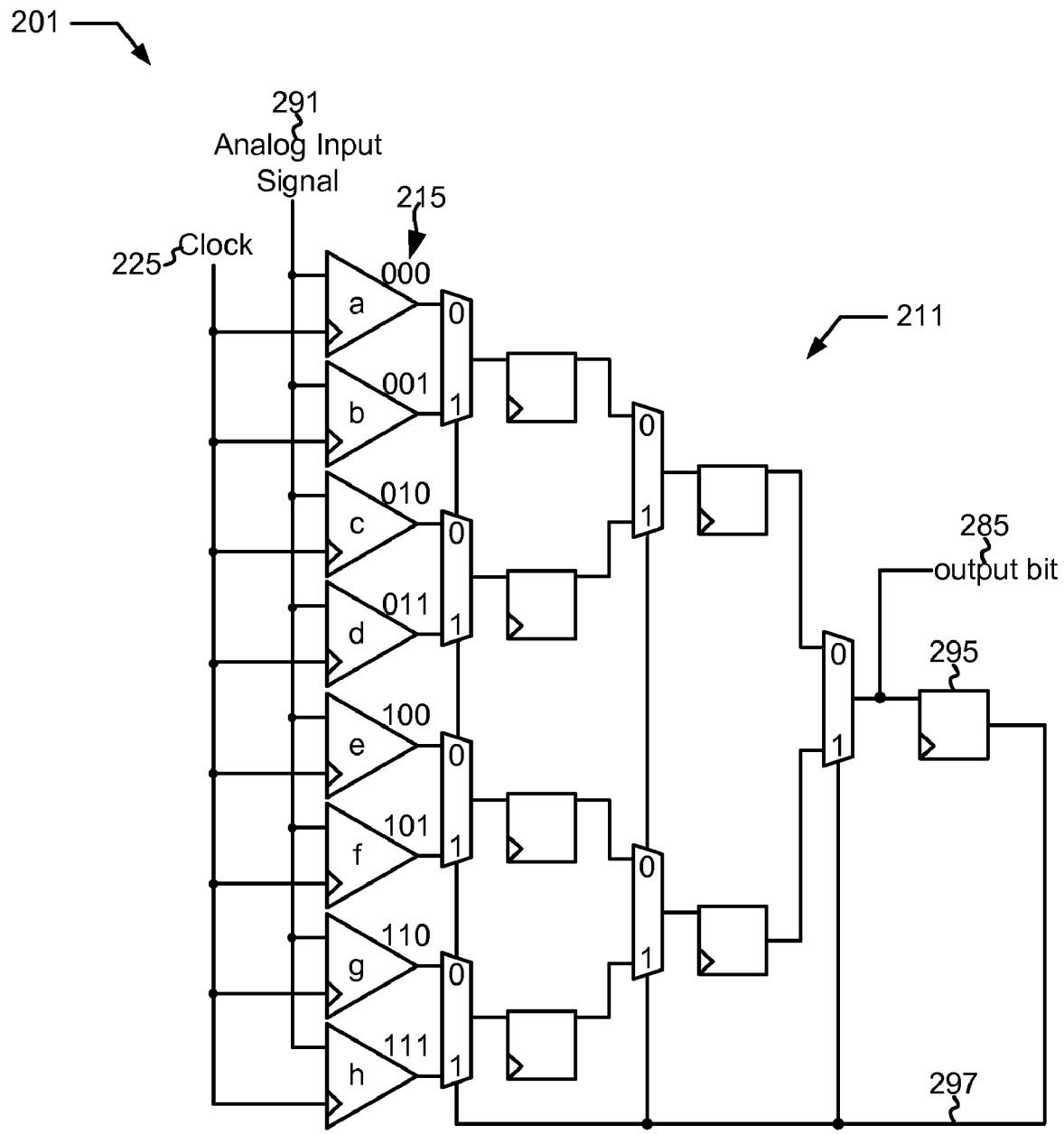
FIG. 2b is another analog to digital converter using a multiplexer tree implemented in synchronized combinatorial logic in accordance with one or more embodiments of the present invention.

As described in U.S. patent application Ser. No. 12/134,488 entitled "Systems and Methods for Analog to Digital Conversion" and filed on a date even herewith by Chmelar et al., an analog to digital converter may be unified with a modified Decision Feedback Equalization (DFE) circuit to yield an advantage in predicting a future range for a dynamic analog to digital converter. The aforementioned application is incorporated herein by reference for all purposes. In particular, the incorporated DFE may reduce or eliminate intersymbol interference that occurs in relation to processing a serial bit sequence in a channel. FIG. 2a and FIG. 2b depict two examples of analog to digital converters that are incorporated with a modified DFE. In such cases, the analog to digital converters use some level of pipelining implemented using a multiplexer tree and intervening registers.

Turning to FIG. 2a, a unified analog to digital converter 200 using a DFE for range selection is depicted. Analog to digital converter 200 utilizes a multiplexer tree similar to that disclosed in U.S. patent application Ser. No. 12/134,523 and filed on a date even herewith by Gribok et al. The aforementioned application is assigned to an entity common hereto, and is incorporated herein by reference for all purposes. Analog to digital converter 200 includes a bank of eight comparators 210 that each compare an analog input 220 against respective reference voltages (not shown). In particular, a distinct reference voltage is provided to each of comparators 210 with the reference voltages extending across the input range of analog to digital converter 200. In some cases, the respective reference voltages are programmable such that the input range of analog to digital converter 200 can be adjusted. Each of comparators 210 is clocked by a respective gated clock that is generated by a bank of AND gates 230. Each of AND gates 230 logically ANDs a clock input 224 with a combination of an enable bit 282 and an enable bit 292. In particular, one quarter of comparators 210 (i.e., comparators a, e) are clocked whenever enable bit 282 and enable bit 292 are both asserted low, and a clock input 224 is asserted high. One quarter of comparators 210 (i.e., comparators d, h) are clocked whenever enable bit 282 and enable bit 292 are both asserted high, and clock input 224 is asserted high. One quarter of comparators 210 (i.e., comparators b, f) are clocked whenever enable bit 282 is asserted low, enable bit 292 is asserted high, and clock input 224 is asserted high. One quarter of comparators 210 (i.e., comparators c, g) are clocked whenever enable bit 282 is asserted high, enable bit 292 is asserted low, and clock input 224 is asserted high. In this way, power is only being dissipated by one quarter of comparators 210 during any given bit period. As more fully discussed in the above mentioned reference that is incorporated herein by reference for all purposes, more enable bits may be generated by saving additional history information which can result in enabling a smaller percentage of comparators 210, or fewer enable bits may be generated in which case a larger percentage of comparators 210 may be clocked on any given clock cycle.

An output bit 284 is equivalent to the output of one of comparators 210 asserted one bit period prior, enable bit 282 is equivalent to the output of one of comparators 210 asserted two bit periods prior, and output bit 292 is equivalent to the output of one of comparators 210 asserted three bit periods prior, with all three being based on previous bit assertions as selected by a synchronized multiplexer tree comprising a first tier of multiplexers 240, a first tier of flip-flops 250, a second tier of multiplexers 260, and a third tier multiplexer 270. Enable bit 282 is stored in a flip-flop 280, and output bit 292 is stored in a flip-flop 290. Enable bits 282, 292 are provided to AND gates 230 to enable clocking of a selected subset of comparators 210. Further, enable bit 292 drives the selector input of the multiplexers in first tier multiplexers 240 and second tier multiplexers 260. Enable bit 282 drives the selector input of third tier multiplexer 280.

Turning to FIG. 2b is another analog to digital converter 201 using a multiplexer tree 211 implemented in synchronized combinatorial logic. Analog to digital converter 201 includes a number of comparators 215 that each compare an analog input 291 against respective reference voltages (not shown) that span the input range of analog to digital comparator 201. In particular, a distinct reference voltage is provided to each of comparators 215 with the reference voltages extending across the input range of analog to digital converter 201. In some cases, the respective reference voltages are programmable such that the input range of analog to digital converter 201 can be adjusted. An output bit 285 of one of comparators 215 is selected using multiplexer tree 211. Output bit 285 is selected based on prior determined outputs such that inter symbol interference is reduced. In particular, output bit 285 is provided to a flip-flop 295. A single enable bit 297 provided from flip-flop 295 is used as a selector input for the different tiers of multiplexer tree 211. The outputs of each tier of multiplexer tree 211 are synchronized to clock signal 225 using flip-flops. In this way, enable bit 297 from flip-flop 295 receives three successive values of output bit 285 (i.e., the value of output bit 285 from three successive bit periods). The three successive values of output bit 285 are used to moved a respective comparator output from one of comparators 215 through multiplexer tree 211 until the output is provided as output bit 285.

Even with extremely fast comparators, the analog to digital converters discussed in relation to FIG. 2a and FIG. 2b offer a maximum data rate of approximately:

$$t_{cq}+t_{mux}+t_{su}<T,$$

where T is the period of the clock used to synchronize the analog to digital converter, $t_{cq}$ is the time required to stabilize a newly clocked flip-flop output, and $t_{su}$ is a setup time for an intervening flip-flop. The maximum data rate is limited regardless of the levels of interleaving, pipelining depth, or speculation bits utilized. This is because flip-flops are used to transfer data between clock periods. Such flip-flops can be very slow circuit elements. For example, in some technologies, the combination of $t_{cq}$ and $t_{su}$ may be 180 ps. Where a data rate of six giga bits per second is desired, the combination of $t_{cq}$ and $t_{su}$ exceeds the clock period (T) making the above described circuits unable to achieve the desired result.

Some embodiments of the present invention provide for retiming an analog to digital converter unified with a modified DFE to achieve higher bandwidth operation than that achievable through use of corresponding un-retimed circuits. In particular, some embodiments of the present invention provide the above mentioned retiming by employing two or more levels of interleaving. This may include, for example, a global level of interleaving along with one or more sub-levels of interleaving. Such a sub-level of interleaving may include a number of sub-level interleave. As an example, where one sub-level of interleaving is employed along with one global level of interleaving, data from the comparators is processed in sub-level interleaves. The output of the sub-level interleaves is passed to the global interleave.

Figure 3A:
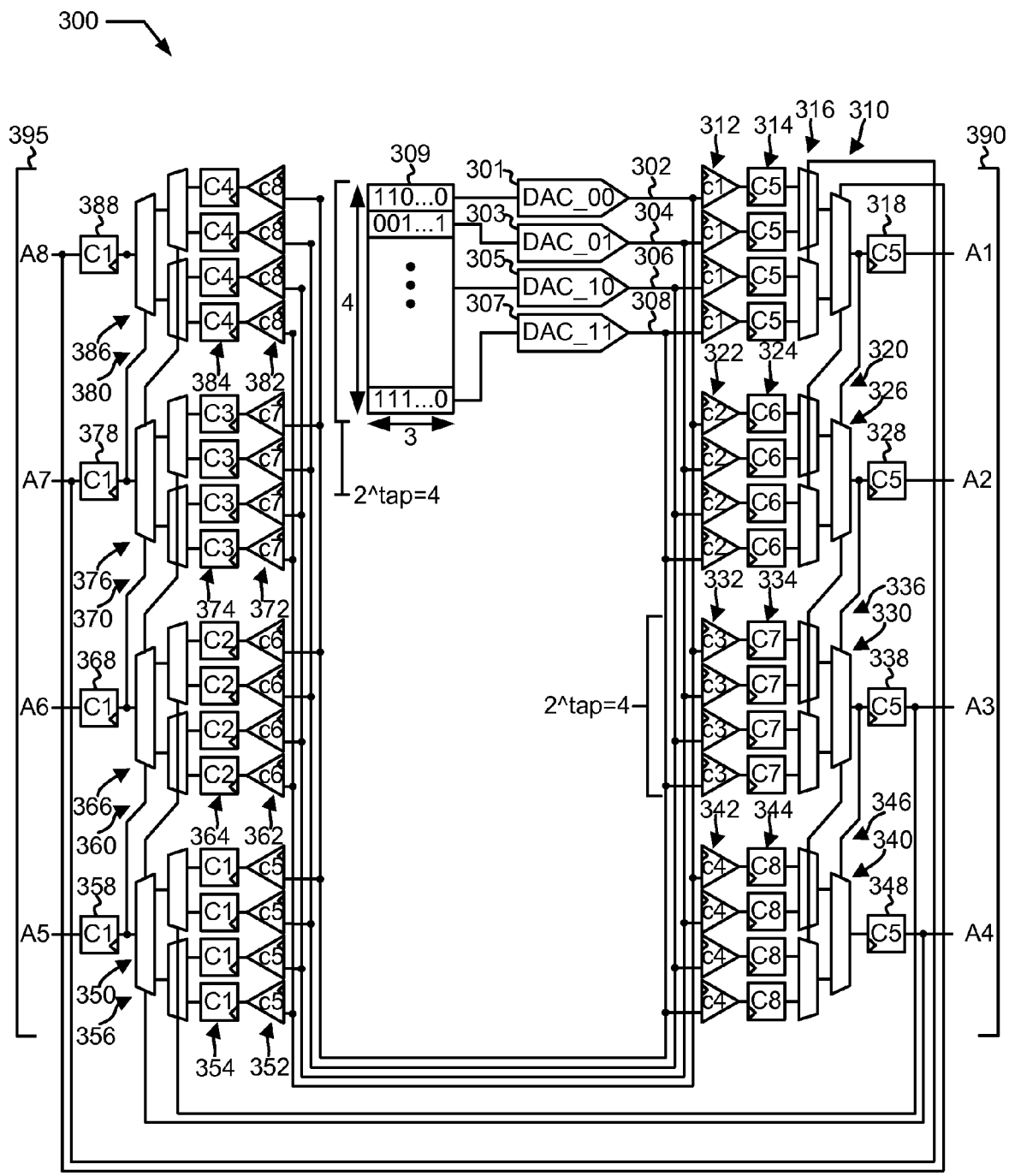
FIG. 3a depicts a synchronous, retimed analog to digital converter in accordance with various embodiments of the present invention.

Turning to FIG. 3a, a synchronous, retimed analog to digital converter 300 is shown in accordance with various embodiments of the present invention. Analog to digital converter 300 is clocked using eight different phases of a master clock. The eight clock phases are labeled c1, c2, c3, c4, c5, c6, c7, c8. In some cases, the eight phases are evenly distributed phases of the master clock, with each of the eight phases being approximately forty-five degrees advanced from the preceding phase. For simplicity, the master clock and eight clock phases are not individually shown. Rather, clocked circuit elements of analog to digital converter 300 are labeled c1-c8 to indicate which of the eight clock phases is used to clock that particular circuit element. Analog to digital converter 300 includes eight sub-level interleaves 310, 320, 330, 340, 350, 360, 370, 380. The eight sub-level interleaves are implemented as two global interleaves 390, 395. In particular, global interleave 390 includes a group of four sub-level interleaves (i.e., sub-level interleaves 310, 320, 330, 340) and global interleave 395 includes a group of four sub-level interleaves (i.e., sub-level interleaves 350, 360, 370, 380).

Analog to digital converter 300 includes a number of comparators that each compare an analog input (not shown) with respective reference voltages 302, 304, 306, 308. Reference voltages 302, 304, 306, 308 are programmed by selecting a particular predefined output from a lookup table 309. The selected outputs from lookup table 309 are provided to four digital to analog converters 301, 303, 305, 307 that in turn drive reference voltages 302, 304, 306, 308, respectively.

Sub-level interleave 310 includes a set of four comparators 312 that each compare the analog input with a respective one of reference voltages 302, 304, 306, 308. The outputs from comparators 312 are registered by respective ones of a set of four flip-flops 314. One of the outputs of flip-flops 314 is selected using a two tier multiplexer 316, and an output of multiplexer 316 is registered by a flip-flop 318. The registered output is labeled A1 on the diagram. Of note, all of comparators 312 and flip-flops 314 are synchronized to clock phase c5. Flip-flop 318 is synchronized to clock phase c5.

Sub-level interleave 320 includes a set of four comparators 322 that each compare the analog input with a respective one of reference voltages 302, 304, 306, 308. The outputs from comparators 322 are registered by respective ones of a set of four flip-flops 324. One of the outputs of flip-flops 324 is selected using a two tier multiplexer 326, and an output of multiplexer 326 is registered by a flip-flop 328. The registered output is labeled A2 on the diagram. Of note, all of comparators 322 are synchronized to clock phase c2, and all of flip-flops 324 are synchronized to clock phase c6. Flip-flop 328 is synchronized to clock phase c5.

Sub-level interleave 330 includes a set of four comparators 332 that each compare the analog input with a respective one of reference voltages 302, 304, 306, 308. The outputs from comparators 332 are registered by respective ones of a set of four flip-flops 334. One of the outputs of flip-flops 334 is selected using a two tier multiplexer 336, and an output of multiplexer 336 is registered by a flip-flop 338. The registered output is labeled A3 on the diagram. Of note, all of comparators 332 are synchronized to clock phase c3, and all of flip-flops 334 are synchronized to clock phase c7. Flip-flop 338 is synchronized to clock phase c5.

Sub-level interleave 340 includes a set of four comparators 342 that each compare the analog input with a respective one of reference voltages 302, 304, 306, 308. The outputs from comparators 342 are registered by respective ones of a set of four flip-flops 344. One of the outputs of flip-flops 344 is selected using a two tier multiplexer 346, and an output of multiplexer 346 is registered by a flip-flop 348. The registered output is labeled A4 on the diagram. Of note, all of comparators 342 are synchronized to clock phase c4, and all of flip-flops 344 are synchronized to clock phase c8. Flip-flop 348 is synchronized to clock phase c5.

Sub-level interleave 350 includes a set of four comparators 352 that each compare the analog input with a respective one of reference voltages 302, 304, 306, 308. The outputs from comparators 352 are registered by respective ones of a set of four flip-flops 354. One of the outputs of flip-flops 354 is selected using a two tier multiplexer 356, and an output of multiplexer 356 is registered by a flip-flop 358. The registered output is labeled A5 on the diagram. Of note, all of comparators 352 are synchronized to clock phase c5, and all of flip-flops 354 are synchronized to clock phase c1. Flip-flop 358 is synchronized to clock phase c1.

Sub-level interleave 360 includes a set of four comparators 362 that each compare the analog input with a respective one of reference voltages 302, 304, 306, 308. The outputs from comparators 362 are registered by respective ones of a set of four flip-flops 364. One of the outputs of flip-flops 364 is selected using a two tier multiplexer 386, and an output of multiplexer 366 is registered by a flip-flop 368. The registered output is labeled A6 on the diagram. Of note, all of comparators 362 are synchronized to clock phase c6, and all of flip-flops 364 are synchronized to clock phase c2. Flip-flop 368 is synchronized to clock phase c1.

Sub-level interleave 370 includes a set of four comparators 372 that each compare the analog input with a respective one of reference voltages 302, 304, 306, 308. The outputs from comparators 372 are registered by respective ones of a set of four flip-flops 374. One of the outputs of flip-flops 374 is selected using a two tier multiplexer 376, and an output of multiplexer 376 is registered by a flip-flop 378. The registered output is labeled A7 on the diagram. Of note, all of comparators 372 are synchronized to clock phase c7, and all of flip-flops 374 are synchronized to clock phase c3. Flip-flop 378 is synchronized to clock phase c1.

Sub-level interleave 380 includes a set of four comparators 382 that each compare the analog input with a respective one of reference voltages 302, 304, 306, 308. The outputs from comparators 382 are registered by respective ones of a set of four flip-flops 384. One of the outputs of flip-flops 384 is selected using a two tier multiplexer 386, and an output of multiplexer 386 is registered by a flip-flop 388. The registered output is labeled A8 on the diagram. Of note, all of comparators 382 are synchronized to clock phase c8, and all of flip-flops 384 are synchronized to clock phase c4. Flip-flop 388 is synchronized to clock phase c1.

The output of multiplexer 316 is selected based on a combination of A7 and A8. In particular, A7 operates to select between the outputs of flip-flops 314 in the first tier of multiplexer 316 and A8 operates to select between the outputs of the first tier of multiplexer 316. The output of multiplexer 326 is selected based on a combination of A8 and the output of multiplexer 316. In particular, A8 operates to select between the outputs of flip-flops 324 in the first tier of multiplexer 326 and the output of multiplexer 316 operates to select between the outputs of the first tier of multiplexer 326. The output of multiplexer 336 is selected based on a combination of the output of multiplexer 316 and the output of multiplexer 326. In particular, the output of multiplexer 316 operates to select between the outputs of flip-flops 334 in the first tier of multiplexer 336 and the output of multiplexer 326 operates to select between the outputs of the first tier of multiplexer 336. The output of multiplexer 346 is selected based on a combination of the output of multiplexer 326 and the output of multiplexer 336. In particular, the output of multiplexer 326 operates to select between the outputs of flip-flops 344 in the first tier of multiplexer 346 and the output of multiplexer 336 operates to select between the outputs of the first tier of multiplexer 346.

The output of multiplexer 356 is selected based on a combination of A3 and A4. In particular, A3 operates to select between the outputs of flip-flops 354 in the first tier of multiplexer 356 and A4 operates to select between the outputs of the first tier of multiplexer 356. The output of multiplexer 366 is selected based on a combination of A4 and the output of multiplexer 356. In particular, A4 operates to select between the outputs of flip-flops 364 in the first tier of multiplexer 366 and the output of multiplexer 356 operates to select between the outputs of the first tier of multiplexer 366. The output of multiplexer 376 is selected based on a combination of the output of multiplexer 356 and the output of multiplexer 366. In particular, the output of multiplexer 356 operates to select between the outputs of flip-flops 374 in the first tier of multiplexer 376 and the output of multiplexer 366 operates to select between the outputs of the first tier of multiplexer 376. The output of multiplexer 386 is selected based on a combination of the output of multiplexer 366 and the output of multiplexer 376. In particular, the output of multiplexer 366 operates to select between the outputs of flip-flops 384 in the first tier of multiplexer 386 and the output of multiplexer 376 operates to select between the outputs of the first tier of multiplexer 386.

Figure 3B:
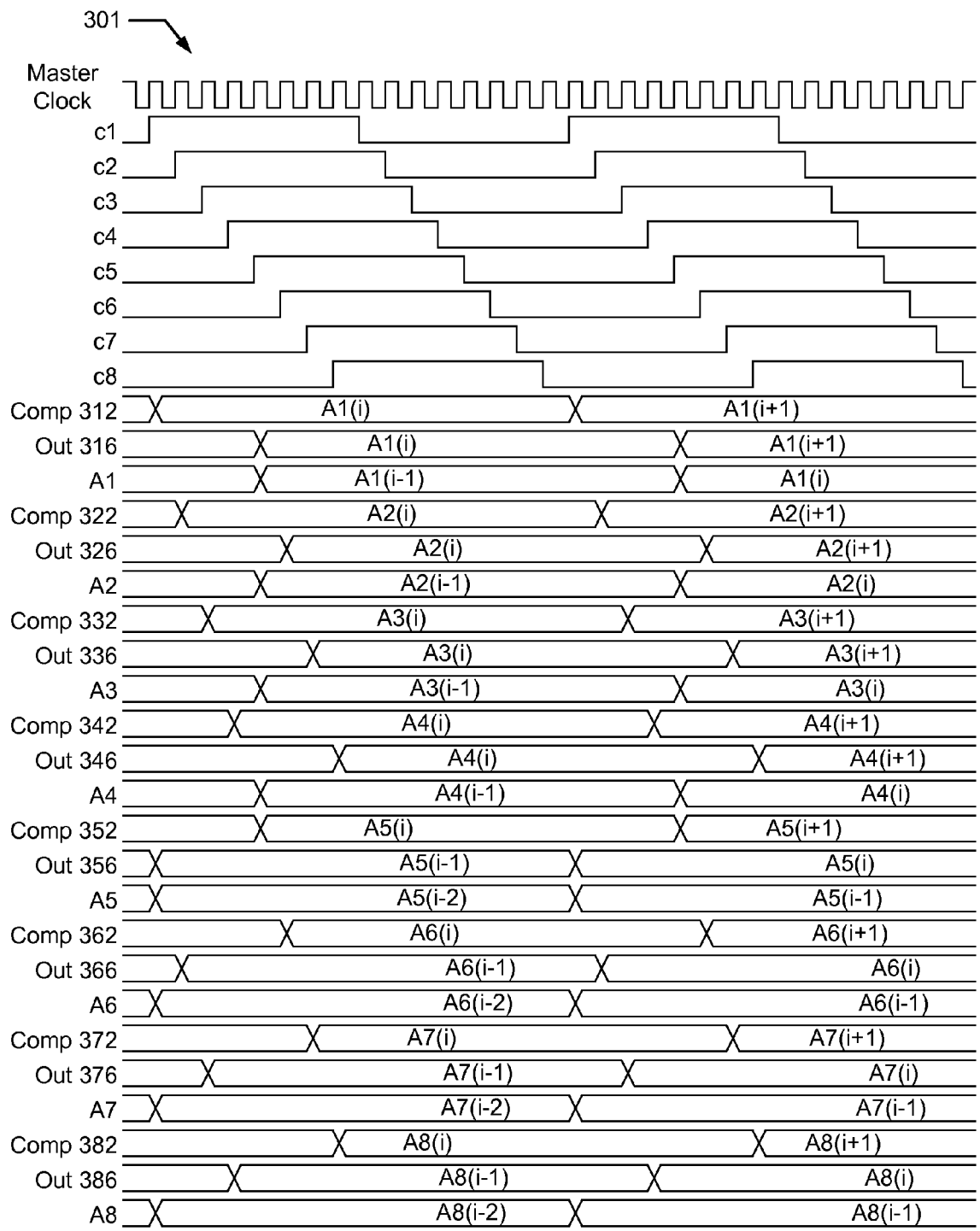

Turning to FIG. 3b, operation of synchronous, retimed analog to digital converter 300 is described in relation to a timing diagram 301. It should be noted that for simplicity clock to q, setup time, and combinatorial delays are not shown. Timing diagram 301 depicts an exemplary operation, and it will be understood by one of ordinary skill in the art that other timing diagrams may be developed to depict other exemplary operations of synchronous, retimed analog to digital converter 300. As shown, on clock c1 comparators 312 are each clocked at the sub-interleave level, flip-flops 354 are clocked making output 356 available, and flip-flops 358, 368, 378, 388 are all clocked making A5-A8 available on the same clock edge at the global interleave level. On clock c2 comparators 322 are each clocked at the sub-interleave level, and flip-flops 364 are each clocked making output 366 available. On clock c3 comparators 332 are each clocked at the sub-interleave level, and flip-flops 374 are each clocked making output 376 available. On clock c4 comparators 324 are each clocked at the sub-interleave level, and flip-flops 384 are each clocked making output 386 available. On clock c5 comparators 352 are each clocked at the sub-interleave level, flip-flops 314 are clocked making output 316 available, and flip-flops 318, 328, 338, 348 are all clocked making A1-A4 available on the same clock edge at the global interleave level. On clock c6 comparators 362 are each clocked at the sub-interleave level, and flip-flops 324 are each clocked making output 326 available. On clock c7 comparators 372 are each clocked at the sub-interleave level, and flip-flops 334 are each clocked making output 336 available. On clock c8 comparators 384 are each clocked at the sub-interleave level, and flip-flops 344 are each clocked making output 346 available. Again, outputs 316, 326, 336, 356, 366, 376 and A3, A4, A7, A8 are used to select the appropriate comparator output.

Synchronous, retimed analog to digital converter 300 performs block processing via two levels of interleaving. In particular, sub-level interleaves 310, 320, 330, 340 interleave based on clocks c1-c4; and sub-level interleaves 350, 360, 370, 380 interleave based on clocks c5-c8. The block outputs from sub-level interleaves 310, 320, 330, 340 are globally interleaved based on clock c5, and the block outputs from sub-level interleaves 310, 320, 330, 340 are globally interleaved based on clock c1. It should be noted that the aforementioned global interleave may be accomplished using other clock phases. For example, sub-level interleaves 310, 320, 330, 340 may be globally interleaved based on clock c8, and the block outputs from sub-level interleaves 310, 320, 330, 340 may be globally interleaved based on clock c4. This approach results in the reduction of one clock period of latency. Based on the disclosure provided herein, one of ordinary skill in the art will recognize a variety of other combinations of sub-level interleaving and global interleaving that are possible in accordance with different embodiments of the present invention.

The retiming of the data transfer occurs between global interleaves. Said another way, the retiming of the data transfer occurs through synchronization using flip-flops 318, 238, 338, 348 using one clock phase and flip-flops 358, 268, 378, 388 using another clock phase. Therefore, the data transfer between one global interleave (i.e., the outputs from sub-level interleaves 310, 320, 330, 340) and the other global interleave (i.e., the outputs from sub-level interleaves 350, 360, 370, 380) has an amount of time that is equal to 4T (i.e., four periods of the master clock depicted in FIG. 3b).

A desired amount of sub-level interleaving and global interleaving may be determined based on latency including comparator delays, flip-flops and multiplexers allowable in the circuit. For example, assume the comparator, flip-flop and multiplexer delays are such that the number of sub-level interleaves (j) is four, and the number of global interleaves (i) is two. Further, assume that an associated data transfer channel exhibits an inter symbol interference characteristic requiring a number of taps (tap) equal to two. The aforementioned design constraints leads to the circuit of FIG. 3a, where the number of taps dictates the four comparators (i.e., 2^tap) in each of sub-level interleaves 310, 320, 330, 340, 350, 360, 370, 380. It will be noted by one of ordinary skill in the art that a modification to the number of taps, the number of sub-level interleaves, or the number of global interleaves will yield different circuit designs. Further, it should be noted that multi-level sub-level interleaves may be possible in accordance with different embodiments of the present invention.

The critical timing yielded through implementation of a synchronous, retimed analog to digital converter in accordance with some embodiments of the present invention are discussed below. The equations accounted for the following variables:
tap=number of taps;
i=global interleaving;
j=sub-interleaving;
T=master clock period;
tcq=flip-flop clock-to-q delay;
tsu=flip-flop setup time;
tmux=multiplexer delay;
tcomp=comparator delay;
ccomp=comparator capacitance;
cwire=wire capacitance.

Assuming that i=2, the following equation represents the timing constraint associated with a synchronous, retimed analog to digital converter:

$$T\text{comp}+tsu<jT; \quad (1)$$

$$tcq+(j+t-1)*tmux+tsu<(j+1)T. \quad (2)$$

Again, for i=2, the number of circuit elements is :
Number of DACs=$2^{tap}$;
Number of Comparators=$2j*2^{tap}$;
Number of Flip-Flops=$2j*(2^{tap}+1)$;
Number of Multiplexers=$2j*(2^{tap}-11)$.

The input capacitance for the circuit is calculated according to the following equation:

$$\text{Input Capacitance}=2j*2^{tap}*c\text{comp}+f(c\text{wire}).$$

Other values for i are possible, however, setting i=2 minimizes the input capacitance. Furthermore, while increasing i can increase the edge to edge time period allowed for performing comparisons (see equation (1) above), it does not increase the edge to edge time period allowed for the flip flops (see equation (2) above).

In general, a synchronous, retimed analog to digital converter with i global interleaves and j sub-interleaves requires (i*j) clock phases (i.e. clock domains), each with a frequency that is 1/(i*j) of the frequency of the master clock. Each of the clock phases are $2\pi p/(i*j)$ out of phase, where p=0 . . . i*j−1.

Figure 1:
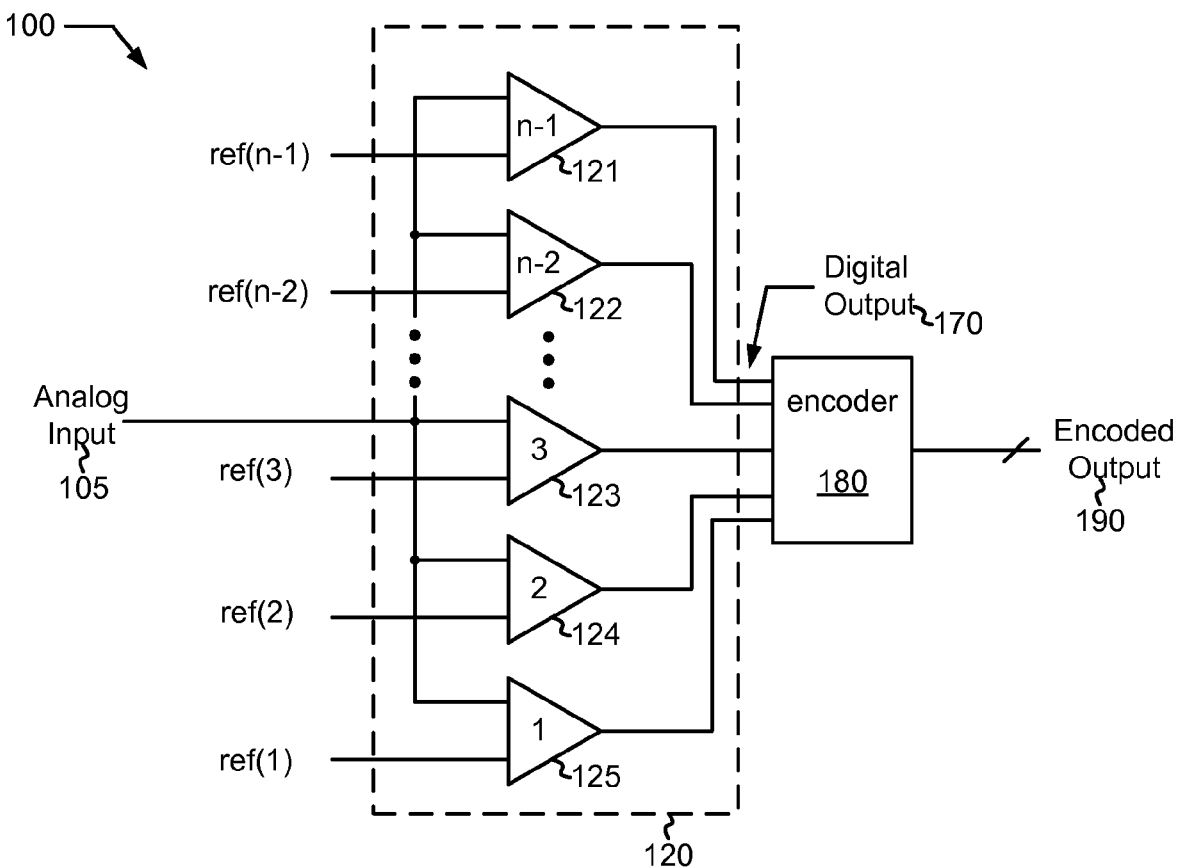
FIG. 1 depicts a prior art flash analog to digital converter.
Figure 4:
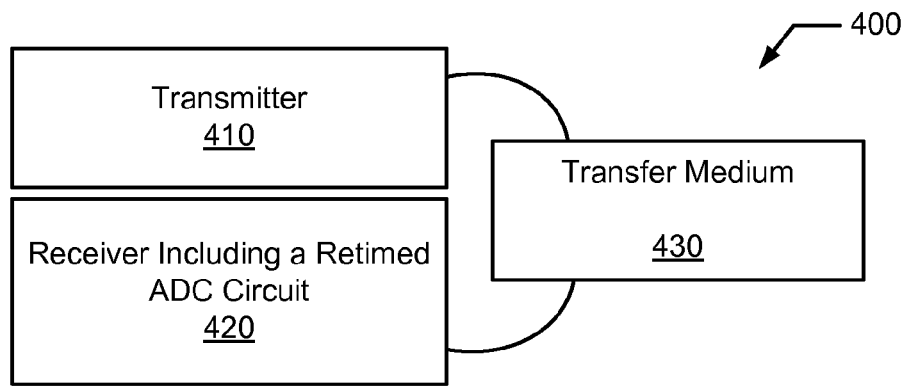
FIG. 4 depicts a communication system including a synchronous, retimed analog to digital converter in accordance with some embodiments of the present invention.

Turning to FIG. 4, a communication system 400 including a receiver 420 with a synchronous, retimed analog to digital converter is shown in accordance with some embodiments of the present invention. Communication system 400 includes a transmitter 410 that transmits a signal representing a data set to receiver 420 via a transfer medium 430. Transfer medium 430 may be, but is not limited to, a wireless transfer medium, a electrically wired transfer medium, a magnetic storage medium, or an optical transfer medium. Based on the disclosure provided herein, one of ordinary skill in the art will recognize a variety of transfer media that may be used in relation to different embodiments of the present invention. Receiver 420 includes synchronous, retimed analog to digital converter similar to that described above in relation to FIG. 3a. In some cases, communication system 400 may be a cellular telephone system with transmitter 410 and receiver 420 being cell phones and/or cell towers. Alternatively, communication system 400 may be a magnetic storage medium with transmitter 410 being a write function, transfer medium 430 being a magnetic storage medium, and receiver 420 being a read function. Based on the disclosure provided herein, one of ordinary skill in the art will recognize a variety of other systems that may be represented as communication system 400 in accordance with different embodiments of the present invention.

In conclusion, the invention provides novel systems, devices, methods and arrangements for analog to digital conversion. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A retimed analog to digital converter circuit, the circuit comprising:
a first set of sub-level interleaves, wherein the first set of sub-level interleaves includes:
a first sub-level interleave, wherein the first sub-level interleave includes a first set of comparators synchronized to a first clock phase;
a second sub-level interleave, wherein the second sub-level interleave includes a second set of comparators synchronized to a second clock phase;
a second set of sub-level interleaves, wherein the second set of sub-level interleaves includes:
a third sub-level interleave, wherein the third sub-level interleave includes a third set of comparators synchronized to a third clock phase;
a fourth sub-level interleave, wherein the fourth sub-level interleave includes a fourth set of comparators synchronized to a fourth clock phase; and
a global interleave, wherein the global interleave selects one of the first set of comparators based at least in part on an output from the second set of sub-level interleaves, and wherein the global interleave selects one of the third set of comparators based at least in part on an output from the first set of sub-level interleaves.

2. The circuit of claim 1, wherein an output of the first sub-level interleave and an output of the second sub-level interleave are synchronized to the third clock phase.

3. The circuit of claim 2, wherein an output of the third sub-level interleave and an output of the fourth sub-level interleave are synchronized to the first clock phase.

4. The circuit of claim 3, wherein the output from the second set of sub-level interleaves is the output of the fourth sub-level interleave synchronized to the first clock phase, and wherein the output from the first set of sub-level interleaves is the output of the second sub-level interleave synchronized to the third clock phase.

5. The circuit of claim 1, wherein the circuit further comprises a number of reference voltages, and wherein each of the number of reference voltages is provided to a respective comparator in each of the first set of comparators, the second set of comparators, the third set of comparators and the fourth set of comparators.

6. The circuit of claim 5, wherein the reference voltages are generated by respective digital to analog converters each receiving a different programmable digital value.

7. The circuit of claim 6, wherein the programmable digital values are maintained in a lookup table.

8. The circuit of claim 1, wherein the outputs from the first set of comparators are provided to a register that is clocked using the third clock phase, and wherein one of the outputs from the register is selected by a multiplexer based at least in part on the output from the second set of sub-level interleaves.

9. The circuit of claim 8, wherein the multiplexer is a first multiplexer, wherein the register is a first register, wherein the outputs from the second set of comparators are provided to a second register that is clocked using the fourth clock phase, and wherein one of the outputs from the second register is selected by a second multiplexer based at least in part on the output from the first multiplexer.

10. The circuit of claim 1, wherein the outputs from the third set of comparators are provided to a register that is clocked using the first clock phase, and wherein one of the outputs from the register is selected by a multiplexer based at least in part on the output from the first set of sub-level interleaves.

11. The circuit of claim 10, wherein the multiplexer is a first multiplexer, wherein the register is a first register, wherein the outputs from the fourth set of comparators are provided to a second register that is clocked using the second clock phase, and wherein one of the outputs from the second register is selected by a second multiplexer based at least in part on the output from the first multiplexer.

12. A method for analog to digital conversion, the method comprising:
    performing a first set of analog to digital conversions using a first set of comparators;
    performing a second set of analog to digital conversions using a second set of comparators;
    performing a third set of analog to digital conversions using a third set of comparators;
    performing a fourth set of analog to digital conversions using a fourth set of comparators;
    selecting a result from the first set of analog to digital conversions based at least in part on a first registered result to provide a first selected result;
    selecting a result from the second set of analog to digital conversions based at least in part on the first selected result to provide a second selected result;
    selecting a result from the third set of analog to digital conversions based at least in part on the second registered result to provide a third selected result; and
    selecting a result from the fourth set of analog to digital conversions based at least in part on the third selected result to provide a fourth selected result;
    registering the fourth selected result to provide the first registered result; and
    registering the second selected result to provide the second registered result.

13. The method of claim 12, wherein performing the first set of analog to digital conversions is synchronized to a first clock phase, wherein performing the second set of analog to digital conversions is synchronized to a second clock phase, wherein performing the third set of analog to digital conversions is synchronized to a third clock phase, and wherein performing the fourth set of analog to digital conversions is synchronized to a fourth clock phase.

14. The method of claim 12, wherein registering the fourth selected result is synchronized to the first clock phase, and wherein registering the second selected result is synchronized to the third clock phase.

15. A communication system, the system comprising:
    a receiver including a retimed analog to digital converter, wherein the retimed analog to digital converter includes:
        a first set of sub-level interleaves, wherein the first set of sub-level interleaves includes:
            a first sub-level interleave, wherein the first sub-level interleave includes a first set of comparators synchronized to a first clock phase;
            a second sub-level interleave, wherein the second sub-level interleave includes a second set of comparators synchronized to a second clock phase;
        a second set of sub-level interleaves, wherein the second set of sub-level interleaves includes:
            a third sub-level interleave, wherein the first sub-level interleave includes a third set of comparators synchronized to a third clock phase;
            a fourth sub-level interleave, wherein the fourth sub-level interleave includes a fourth set of comparators synchronized to a fourth clock phase; and
        a global interleave, wherein the global interleave selects one of the first set of comparators based at least in part on an output from the second set of sub-level interleaves, and wherein the global interleave selects one of the third set of comparators based at least in part on an output from the first set of sub-level interleaves.

16. The system of claim 15, wherein the system further includes a transmitter and a medium, and wherein information is provided from the transmitter to the receiver via the medium.

17. The system of claim 16, wherein the system is a storage system, and wherein the medium is a storage medium.

18. The system of claim 16, wherein the system is a wireless communication system, and wherein the medium is a wireless communication medium.

19. The system of claim 15, wherein the outputs from the first set of comparators are provided to a first register that is clocked using the third clock phase, wherein one of the outputs from the first register is selected by a first multiplexer based at least in part on the output from the second set of sub-level interleaves, wherein the output from the first multiplexer is provided to a third register that is clocked using the third clock phase, wherein the outputs from the second set of comparators are provided to a second register that is clocked using the fourth clock phase, wherein one of the outputs from the second register is selected by a second multiplexer based at least in part on the output from the first multiplexer, and wherein the output from the second multiplexer is provided to a fourth register that is clocked using the third clock phase.

20. The system of claim 15, wherein the outputs from the third set of comparators are provided to a first register that is clocked using the first clock phase, wherein one of the outputs from the first register is selected by a first multiplexer based at least in part on the output from the first set of sub-level interleaves, wherein the output from the first multiplexer is provided to a third register that is clocked using the first clock phase, wherein the outputs from the second set of comparators are provided to a second register that is clocked using the second clock phase, wherein one of the outputs from the second register is selected by a second multiplexer based at least in part on the output from the first multiplexer, and wherein the output from the second multiplexer is provided to a fourth register that is clocked using the first clock phase.

* * * * *